(12) United States Patent
Dennison et al.

(10) Patent No.: US 8,699,267 B2
(45) Date of Patent: Apr. 15, 2014

(54) SEMICONDUCTOR PHASE CHANGE MEMORY USING FACE CENTER CUBIC CRYSTALLINE PHASE CHANGE MATERIAL

(71) Applicant: Ovonyx, Inc., Sterling Heights, MI (US)

(72) Inventors: Charles H. Dennison, Boise, ID (US); Stephen J. Hudgens, Santa Clara, CA (US)

(73) Assignee: Ovonyx, Inc., Sterling Heights, MI (US)

( * ) Notice: Subject to any disclaimer, the term of this patent is extended or adjusted under 35 U.S.C. 154(b) by 0 days.

(21) Appl. No.: 13/910,237

(22) Filed: Jun. 5, 2013

(65) Prior Publication Data

US 2013/0270502 A1 Oct. 17, 2013

Related U.S. Application Data

(62) Division of application No. 13/526,686, filed on Jun. 19, 2012, now Pat. No. 8,462,545, which is a division of application No. 13/315,374, filed on Dec. 9, 2011, now Pat. No. 8,223,538, which is a division of application No. 12/764,157, filed on Apr. 21, 2010, now Pat. No. 8,098,519, which is a division of application No. 11/973,565, filed on Oct. 9, 2007, now Pat. No. 7,729,162.

(51) Int. Cl.
*G11C 11/00* (2006.01)

(52) U.S. Cl.
USPC .......................................... 365/163; 365/148

(58) Field of Classification Search
USPC ............ 365/46, 94, 100, 113, 129, 148, 163; 257/2–5, 296, E31.047, E27.006; 438/29, 95, 96, 166, 259, 365, 482, 438/486, 597; 977/754
See application file for complete search history.

(56) References Cited

U.S. PATENT DOCUMENTS

| | | | | |
|---|---|---|---|---|
| 5,341,328 A * | 8/1994 | Ovshinsky et al. | ........... | 365/163 |
| 5,406,509 A * | 4/1995 | Ovshinsky et al. | ........... | 365/113 |
| 5,596,522 A * | 1/1997 | Ovshinsky et al. | ........... | 365/113 |
| 7,638,786 B2 * | 12/2009 | Matsui et al. | ..................... | 257/2 |
| 2006/0105556 A1* | 5/2006 | Matsui et al. | ................. | 438/584 |
| 2007/0018148 A1* | 1/2007 | Kuo et al. | ......................... | 257/2 |
| 2008/0273378 A1* | 11/2008 | Philipp et al. | ................. | 365/163 |

* cited by examiner

*Primary Examiner* — Harry W Byrne
(74) *Attorney, Agent, or Firm* — Trop, Pruner & Hu, P.C.

(57) ABSTRACT

In accordance with some embodiments, a phase change memory may be formed in which the thermal conductivity in the region outside the programmed volume of phase change material is reduced. This may reduce the power consumption of the resulting phase change memory. The reduction in power consumption may be achieved by forming distinct layers of phase change material that have little or no mixing between them outside the programmed volume. In one embodiment, a face centered cubic chalcogenide structure may be utilized.

3 Claims, 2 Drawing Sheets

SEMICONDUCTOR PHASE CHANGE MEMORY USING FACE CENTER CUBIC CRYSTALLINE PHASE CHANGE MATERIAL

CROSS-REFERENCE TO RELATED APPLICATIONS

This application is a divisional of U.S. patent application Ser. No. 13/526,686, filed on Jun. 19, 2012, which is a divisional of U.S. patent application Ser. No. 13/315,374, filed on Dec. 9, 2011, which issued as U.S. Pat. No. 8,223,538, which is a divisional of U.S. patent application Ser. No. 12/764,157, filed on Apr. 21, 2010, which issued as U.S. Pat. No. 8,098,519, which is a divisional of U.S. patent application Ser. No. 11/973,565, filed on Oct. 9, 2007, which issued as U.S. Pat. No. 7,729,162.

BACKGROUND

This relates generally to phase change memories that use phase change materials, such as pnictide or chalcogenide materials.

Phase change memory devices use phase change materials, i.e., materials that may be electrically switched between a generally amorphous and a generally crystalline state, for electronic memory application. One type of memory element utilizes a phase change material that may be, in one application, electrically switched between a structural state of generally amorphous and generally crystalline local order or between different detectable states of local order across the entire spectrum between completely amorphous and completely crystalline states. The state of the phase change material is also non-volatile in that, when set in either a crystalline, semi-crystalline, amorphous, or semi-amorphous state representing a resistance value, that value is retained until changed by another programming event, as that value represents a phase or physical state of the material (e.g., crystalline or amorphous). The state is unaffected by removing electrical power.

DETAILED DESCRIPTION

Figure 1:
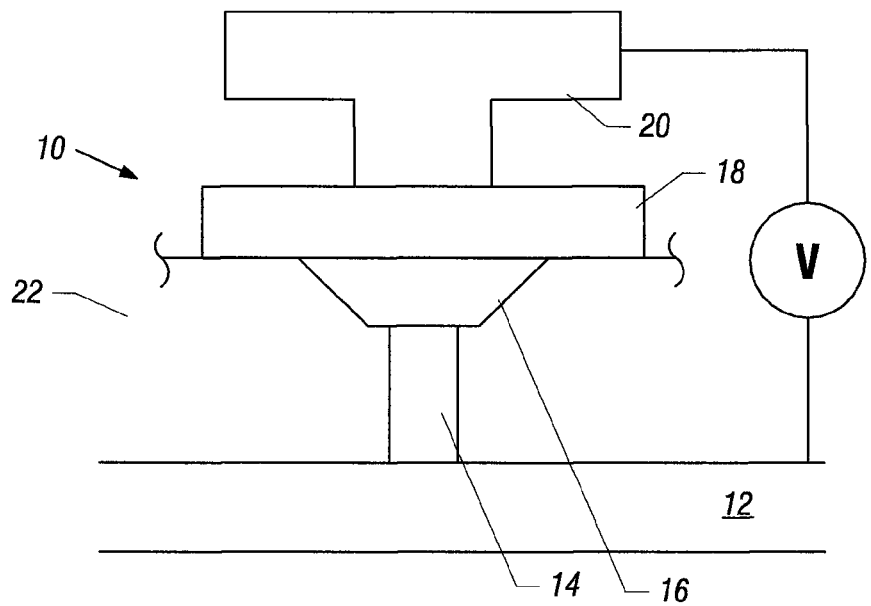
FIG. 1 is a schematic depiction of a phase change memory in accordance with one embodiment.

Referring to FIG. 1, a phase change memory cell 10 may include a lower interconnect 12, an upper interconnect 20, and a potential V between them that causes a current to flow through a via 14 to a phase change memory element 16 and a threshold or access device 18 that, in one embodiment, may be an ovonic threshold switch. By virtue of the passage of current through the memory element 16, the memory element 16 may be caused to change phase. If the memory element 16 is made of a phase change material, the material may change between amorphous and crystalline phases or between various levels between fully amorphous and fully crystalline phases.

The memory element 16 may be formed in a dielectric layer 22 for electrical isolation and the layer 22 may have low thermal conductivity in order to reduce heat loss. In general, it is desirable to reduce current flow to the greatest possible extent to reduce power consumption of a memory which includes a large number of cells of the type shown in FIG. 1. The lower the thermal conductivity of the phase change material forming the element 16, the lower the programming current. In particular, the thermal conductivity of the phase change material outside the programmed volume (that is switched between amorphous and crystalline phases) may be reduced.

Typically, the phase change material forming the memory element 16 may be $Ge_2Sb_2Te_5$ (GST). The GST may be deposited on the via 14 in an homogenous film that generally is in a hexagonal close packed crystalline state after a relatively high and long temperature cycle or annealing step. The temperature cycle is preferably at a temperature of at least 300° C. and more preferably at a temperature of at least 350° C. The temperature cycle preferably lasts for at least 20 minutes and more preferably lasts for at least 25 minutes. In one embodiment, the temperature cycle is at a temperature of between 375° C. and 425° C. and lasts for at least 30 minutes. The phase change material may generally be a chalcogenide or pnictide material, where chalcogenide materials include an element from column VI of the periodic table (e.g. S, Se, or Te) and pnictide materials include an element from column V of the periodic table (e.g. P, As, or Sb).

Figure 2:
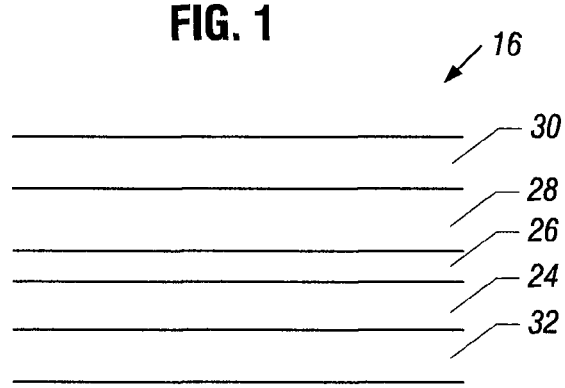
FIG. 2 is a depiction of a phase change memory element in accordance with one embodiment.

The thermal heat conduction in the non-programmed portion of a phase change material of the memory element 16 may be reduced. This reduction may be done, in one embodiment, by depositing the chalcogenide material in thin layers to create a multilayer structure. For example, referring to FIG. 2, the memory element 16 may be formed of at least two distinct layers 28 and 24, between electrodes 32 and 30.

The particular material that is utilized for the layers 24 and 28 may have the greatest possible mismatch of acoustic impedance at the film interfaces. The thicknesses of the layers 24 and 28 and the number of layers may be chosen such that the overall thermal conductivity is reduced to the greatest possible extent in one embodiment.

The minimum thermal conductivity is approximately when the layer thickness of a given film in the layered structure is somewhat smaller than the mean free path of phonons. To effectively utilize such a structure in a phase change memory cell, the multilayered structure may remain in distinct layers as deposited throughout all the subsequent thermal fabrication steps. Thus, if the layered film simply interdiffuses during subsequent high temperature fabrication steps, the benefit may be reduced.

In one embodiment, the subsequent diffusion may be reduced by incorporating a diffusion barrier between the distinct layers 24 and 28. For example, a barrier layer 26 may be formed by a separate deposited film or the barrier layer 26 may be provided during the deposition process near the end of the deposition of the layer 24 and at the beginning of the deposition of layer 28. In other words, an oxygen or nitrogen or combined oxygen and nitrogen atmosphere may be utilized during the appropriate phase of the deposition. For example, if the deposition method is physical vapor deposition, then either or both of oxygen and nitrogen gas may be introduced while sputtering the final monolayers of the phase change film 24 or the initial monolayers of the film 28. Alternatively, after phase change films 24, 28 are deposited, oxygen and/or nitrogen may be deposited on the freshly deposited film with the addition of heat or plasma to incorporate the nitrogen and/or oxygen at the surface.

The introduced additives may also introduce additional interface phonon scattering that may reduce the thermal conductivity in both the plane and cross-plane directions. Other additives that make strong bonds with phase change alloy layers, but do not diffuse into the alloy during normal fabrication thermal steps, include carbon, boron, and silicon, which may be used in addition to or in conjunction with nitrogen and/or oxygen.

Other deposition techniques may also be used, including atomic layer deposition and metal organic chemical vapor deposition (MOCVD) to create the same multilayer structures with appropriate optional introduction of interface additives between the distinct layers to preserve the layered structure throughout the fabrication process.

While an embodiment with two layers of phase change material is shown, more layers would generally show improved results. Thus, in some embodiments, four to eight phase change layers may be desirable with the phase change layers separated by a diffusion barrier.

Thus, it is desirable to maintain the distinctness of the phase change layers throughout the fabrication process. In the programmed volume where the phase change takes place, sufficient heat is generated to induce interdiffusion of two or more phase change layers. In one embodiment, the heat generated by passage of current through the programmed volume induces melting of two or more phase change layers to form a molten state. In the molten state there is sufficient diffusion of layered films to combine into the desired phase change alloy composition, based on the thickness ratio of the deposited layers. Thus, in the programmed volume, where conductivity is needed, higher conductivity is provided. Outside the programmed volume where low thermal conductivity is needed, lower thermal conductivity is provided. Ideally, the multilayered structure is maintained outside the melt, recrystallization region to retain a reduced thermal conductivity.

In one embodiment, reduced thermal conductivity is achieved in a multilayer structure by preventing interdiffusion of different phase change layers outside the programmed volume. In one embodiment, a phase change memory device includes a first phase change layer, a second phase change layer, and a third phase change layer disposed between two electrodes. Application of a voltage between the two electrodes induces passage of a current between the two electrodes where the current induces interdiffusion of the first and second phase change layers without inducing interdiffusion of the third phase change layer with either the first or second phase change layers. In another embodiment, the programmed volume of the phase change memory device may include three or more phase change layers, each of which interdiffuses with at least one other phase change layer within the programmed volume during passage of a current and none of which interdiffuses with a phase change layer positioned outside of the programmed volume. In other embodiments, the phase change memory may include two or more phase change layers outside the programmed volume, none of which interdiffuses with each other or with a phase change layer positioned within the programmed volume during passage of a current between the two electrodes.

The reduction in thermal conductivity outside the melt region may be more significant for confined phase change memory elements where the programmed region is physically separated by a greater distance from either the top or bottom electrodes. This increased separation is maintained in regions adjacent the electrode where reduced thermal conductivity may be most critical.

Alternatively, the phase change material can be deposited in the face centered cubic phase with minimization of all thermal processing post deposition to maintain the face centered cubic phase. The face centered cubic phase has reduced thermal conductivity compared to other phases, including the hexagonal close packed phase.

Programming of the phase change material to alter the state or phase of the memory element 16 may be accomplished by applying voltage potentials through a select device, formed on a substrate, thereby generating a voltage potential across the memory element 16. When the voltage potential is greater than the threshold voltage of memory element, then an electrical current may flow through the phase change material in response to the applied voltage potentials, and may result in heating of the phase change material in the programmed volume.

This heating may alter the memory state or phase of the phase change material. Altering the phase or state of the phase change material may alter the electrical characteristic of memory material, e.g., the resistance of the material may be altered by altering the phase of the memory material. Memory material may also be referred to as a programmable resistive material.

In the "reset" state, memory material may be in an amorphous or semi-amorphous state and in the "set" state, memory material may be in a crystalline or semi-crystalline state. Both "reset" and "set" states can exist without any energy (electrical, optical, mechanical) applied to bistable chalcogenide. The resistance of memory material in the amorphous or semi-amorphous state may be greater than the resistance of memory material in the crystalline or semi-crystalline state. It is to be appreciated that the association of reset and set with amorphous and crystalline states, respectively, is a convention and that at least an opposite convention may be adopted.

Using electrical current, memory material may be heated to a relatively higher temperature to amorphize memory material and "reset" memory material (e.g., program memory material to a logic "0" value). Heating the volume of memory material to a relatively lower crystallization temperature may crystallize memory material and "set" memory material (e.g., program memory material to a logic "1" value). Various resistances of memory material may be achieved to store information by varying the amount of current flow and duration through the volume of memory material.

Figure 3:
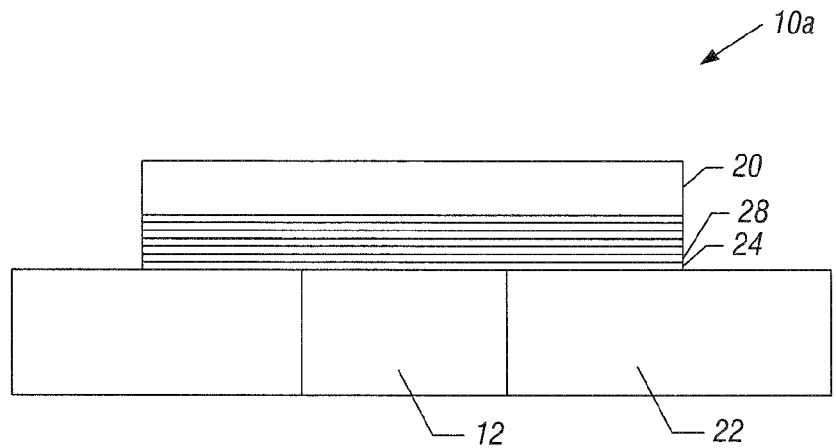
FIG. 3 is a depiction of a phase change memory element in accordance with one embodiment.

Referring to FIG. 3, in accordance with one embodiment, a pillar/plug cell 10a may include a top electrode 20 formed over alternating layers of phase change material 24 and 28. In some cases, alternating diffusion barrier layers (not shown) may be provided. The alternating phase change memory layers 24 and 28 may be positioned over a substrate 22, having a bottom electrode 12 formed therein in conventional fashion.

Figure 4:
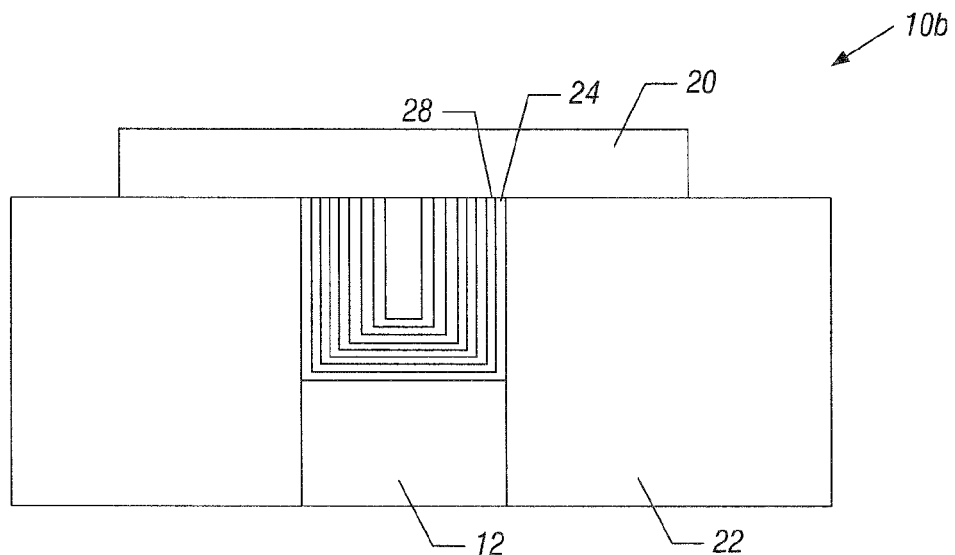
FIG. 4 is a depiction of a phase change memory element in accordance with one embodiment.

Referring to FIG. 4, in accordance with still another embodiment, a phase change memory 10b may be formed of a confined cell. In this case, a pore formed in an insulator or dielectric layer 22 may have a bottom electrode 12 formed in that pore. In the upper part of the pore may be formed alternating layers 24 and 28 of phase change material such as chalcogenide. In some cases, the alternating layers may be separated by a diffusion barrier as described previously. A top electrode 20 may be defined over the pore and in contact with the alternating phase change layers 24 and 28. Thus, the alternating phase change layers 24 and 28 have a folded U-shaped configuration within the pore.

Figure 5:
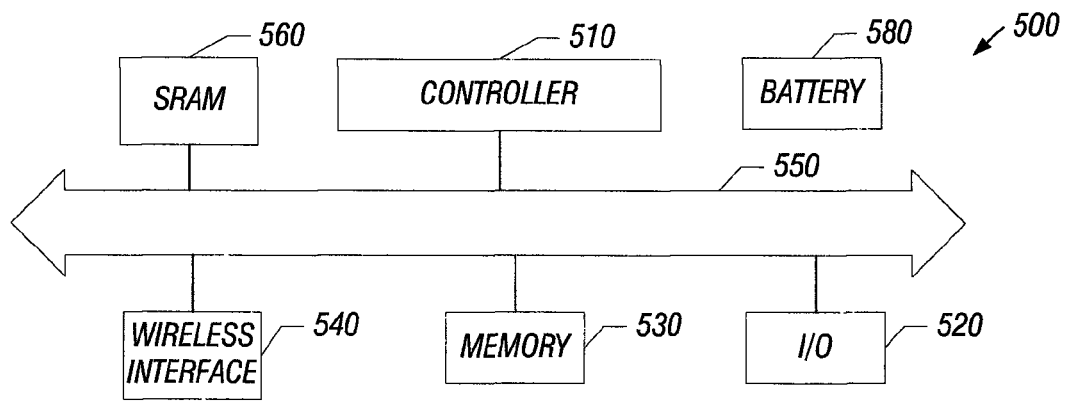
FIG. 5 is a system depiction for one embodiment.

Turning to FIG. 5, a portion of a system 500 in accordance with an embodiment of the present invention is described. System 500 may be used in wireless or mobile devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 500 may be used in any of the following systems: a wireless local area network (WLAN) system, a wireless personal area network (WPAN) system, a cellular network, although the scope of the present invention is not limited in this respect.

System 500 may include a controller 510, an input/output (I/O) device 520 (e.g. a keypad, display), static random access memory (SRAM) 560, a memory 530, and a wireless interface 540 coupled to each other via a bus 550. A battery 580 may be used in some embodiments. It should be noted that the scope of the present invention is not limited to embodiments having any or all of these components.

Controller 510 may comprise, for example, one or more microprocessors, digital signal processors, microcontrollers, or the like. Memory 530 may be used to store messages transmitted to or by system 500. Memory 530 may also optionally be used to store instructions that are executed by controller 510 during the operation of system 500, and may be used to store user data. Memory 530 may be provided by one or more different types of memory. For example, memory 530 may comprise any type of random access memory, a volatile memory, a non-volatile memory such as a flash memory and/or a memory such as memory discussed herein.

I/O device 520 may be used by a user to generate a message. System 500 may use wireless interface 540 to transmit and receive messages to and from a wireless communication network with a radio frequency (RF) signal. Examples of wireless interface 540 may include an antenna or a wireless transceiver, although the scope of the present invention is not limited in this respect.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
    forming a first electrode;
    forming a second electrode;
    depositing a face centered cubic crystalline phase change material between said electrodes.

2. The method of claim 1 including forming a memory by preserving said face centered cubic crystalline phase.

3. The method of claim 2 wherein preserving includes controlling exposure of said phase to a temperature that changes the crystalline structure of said phase until fabrication of said memory is complete.

* * * * *